(12) United States Patent
Qian et al.

(10) Patent No.: US 10,930,212 B2
(45) Date of Patent: Feb. 23, 2021

(54) PIXEL DRIVING CIRCUIT AND METHOD, DISPLAY PANEL AND DISPLAY DEVICE

(71) Applicant: Shanghai Tianma Micro-Electronics Co., Ltd., Shanghai (CN)

(72) Inventors: Xu Qian, Shanghai (CN); Hua Gong, Shanghai (CN); Jun Zhang, Shanghai (CN)

(73) Assignee: Shanghai Tianma Micro-Electronics Co., Ltd., Shanghai (CN)

( * ) Notice: Subject to any disclaimer, the term of this patent is extended or adjusted under 35 U.S.C. 154(b) by 43 days.

(21) Appl. No.: 16/393,910

(22) Filed: Apr. 24, 2019

(65) Prior Publication Data
US 2019/0251902 A1    Aug. 15, 2019

(30) Foreign Application Priority Data
Dec. 28, 2018 (CN) .......................... 201811621849.5

(51) Int. Cl.
*G09G 3/3233* (2016.01)
*G09G 3/3266* (2016.01)
(Continued)

(52) U.S. Cl.
CPC ......... *G09G 3/3233* (2013.01); *G09G 3/3266* (2013.01); *G09G 3/3291* (2013.01); *H01L 27/3276* (2013.01); *G09G 2300/0426* (2013.01); *G09G 2300/0439* (2013.01); *G09G 2300/0809* (2013.01)

(58) Field of Classification Search
CPC ............. G09G 3/03233; G09G 3/3266; G09G 3/3291; G09G 2300/0426; G09G 2300/0439; G09G 2300/0809
See application file for complete search history.

(56) References Cited

U.S. PATENT DOCUMENTS

| 2015/0287360 A1* | 10/2015 | Yin ...................... H01L 27/3265 345/690 |
| 2018/0286314 A1* | 10/2018 | Cho ...................... H01L 51/5203 |
| 2019/0333446 A1* | 10/2019 | Yin ...................... G09G 3/3266 |

FOREIGN PATENT DOCUMENTS

| CN | 103187024 A | 7/2013 |
| CN | 105702210 B | 3/2018 |

* cited by examiner

*Primary Examiner* — Lixi C Simpson
(74) *Attorney, Agent, or Firm* — Kilpatrick Townsend & Stockton, LLP

(57) ABSTRACT

The present disclosure provides an organic light-emitting pixel driving circuit. The organic light-emitting pixel driving circuit includes first driving transistor, having first terminal electrically connected to first node, second terminal electrically connected to second node, and control terminal electrically connected to third node, second driving transistor, having first terminal electrically connected to the second node, second terminal electrically connected to fourth node, and control terminal electrically connected to the third node; first switch transistor, having first terminal electrically connected to data signal terminal, and second terminal electrically connected to the first node, second switch transistor, having first terminal electrically connected to the data signal terminal, and second terminal electrically connected to the fourth node; third switch transistor, having first terminal electrically connected to the third node, and second terminal electrically connected to the second node; and storage device electrically connected to the third node.

13 Claims, 10 Drawing Sheets

(51) Int. Cl.
*G09G 3/3291* (2016.01)
*H01L 27/32* (2006.01)

US 10,930,212 B2

PIXEL DRIVING CIRCUIT AND METHOD, DISPLAY PANEL AND DISPLAY DEVICE

CROSS-REFERENCE TO RELATED APPLICATIONS

The present application claims priority to Chinese Patent Application No. 201811621849.5, filed on Dec. 28, 2018, the content of which is incorporated herein by reference in its entirety.

TECHNICAL FIELD

The present disclosure relates to the field of display technologies, and in particular, to an organic light-emitting pixel driving circuit and method, a display panel, and a display device.

BACKGROUND

With the development of display technologies, an Organic Light Emitting Display (OLED) panel has been used in more and more applications due to its excellent characteristics such as self-illumination, high brightness, wide viewing angle and fast response. With the increase in the display resolution and scan rate, charging time becomes shorter, which leads to insufficient charging and thus adversely affecting display.

SUMMARY

The present disclosure provides an organic light-emitting pixel driving circuit and method, a display panel, and a display device, which can improve the poor display caused by insufficient charging time.

In one embodiment of the present disclosure provides an organic light-emitting pixel driving circuit, including: a first driving transistor, having a first terminal electrically connected to a first node, a second terminal electrically connected to a second node, and a control terminal electrically connected to a third node; a second driving transistor, having a first terminal electrically connected to the second node, a second terminal electrically connected to a fourth node, and a control terminal electrically connected to the third node; a first switch transistor, having a first terminal electrically connected to a data signal terminal, and a second terminal electrically connected to the first node; a second switch transistor, having a first terminal electrically connected to the data signal terminal, and a second terminal electrically connected to the fourth node; a third switch transistor, having a first terminal electrically connected to the third node, and a second terminal electrically connected to the second node; and a storage unit electrically connected to the third node.

Another embodiment of the present disclosure provides a display penal including the organic light-emitting pixel driving circuit described above.

In yet another embodiment of the present disclosure provides a display device including the display panel described above.

BRIEF DESCRIPTION OF DRAWINGS

In order to more clearly illustrate technical solutions in embodiments of the present disclosure or in the related art, the accompanying drawings used in the embodiments and in the related art are briefly introduced as follows. It should be noted that the drawings described as follows are merely part of the embodiments of the present disclosure.

DESCRIPTION OF EMBODIMENTS

Embodiments of the present disclosure are described in the following with reference to the accompanying drawings. It should be understood that the described embodiments are merely exemplary embodiments of the present disclosure, which shall not be interpreted as providing limitations to the present disclosure.

The terms used in the embodiments of the present disclosure are merely for the purpose of describing particular embodiments but not intended to limit the present disclosure. Unless otherwise noted in the context, the singular form expressions "a", "an", "the" and "said" used in the embodiments and appended claims of the present disclosure are also intended to represent plural form expressions thereof.

Figure 1:
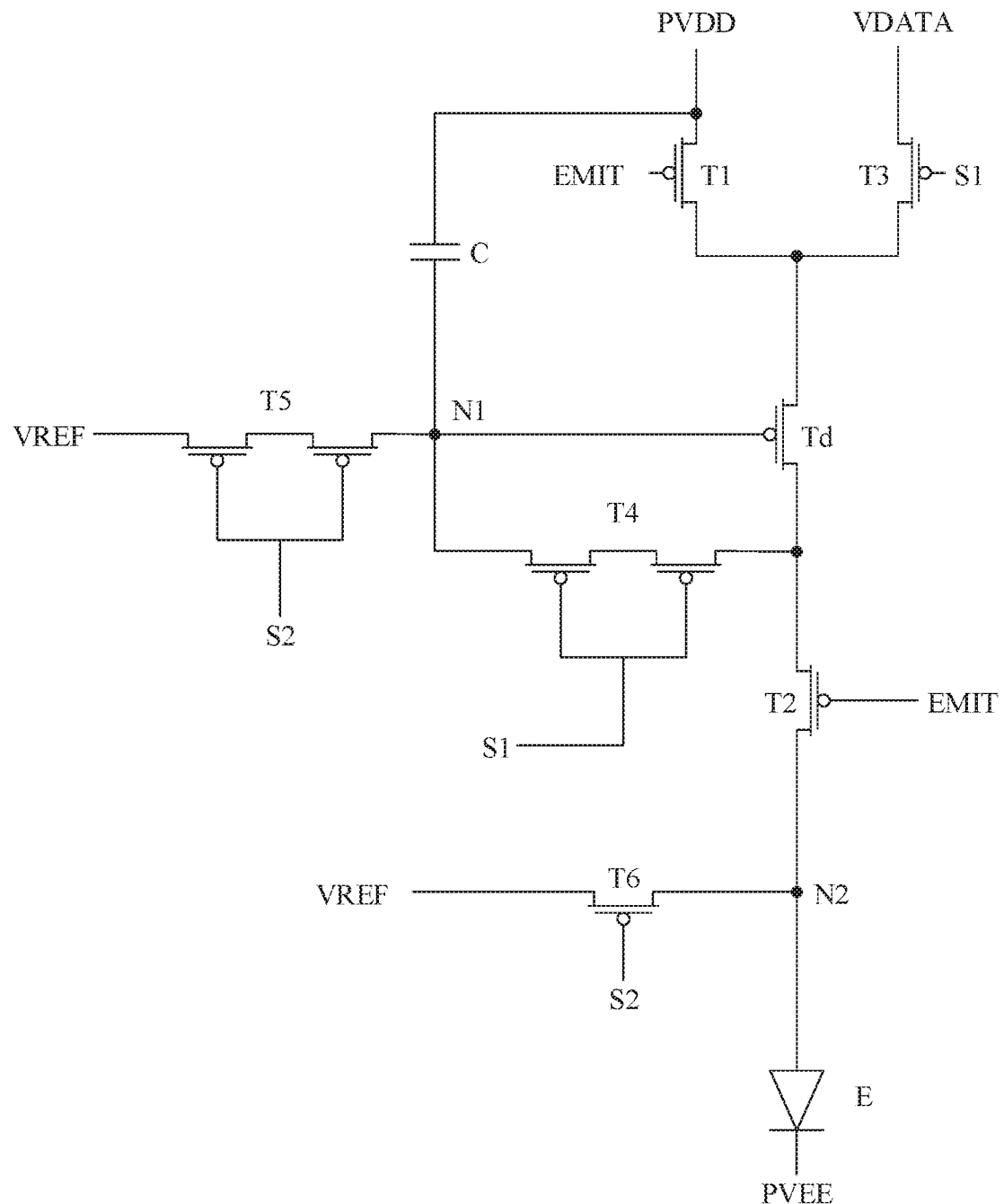
FIG. 1 is a schematic structural diagram of an organic light-emitting pixel driving circuit in the related art.
Figure 2:
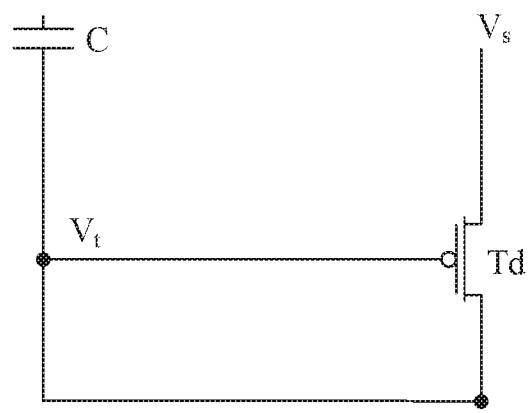
FIG. 2 is an equivalent circuit diagram of a part of the pixel driving circuit of FIG. 1 in a compensation phase.
Figure 3:
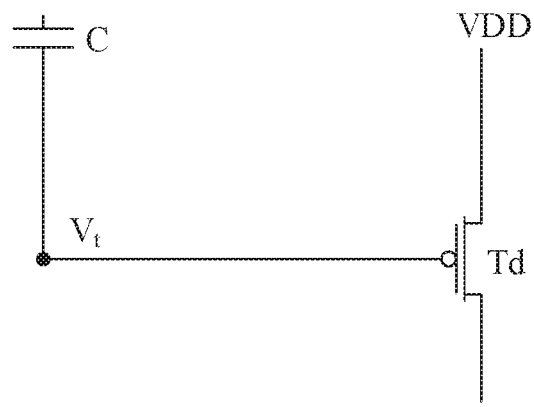
FIG. 3 is an equivalent circuit diagram of a part of the pixel driving circuit of FIG. 1 in a light-emitting phase.

Embodiments of the present disclosure show a process of discovering the problems in the related art will be first described before describing the embodiments of the present disclosure in detail. FIG. 1 is a schematic structural diagram of an organic light-emitting pixel driving circuit in the related art. As shown in FIG. 1, the organic light-emitting pixel driving circuit in the related art includes first to sixth switch transistors T1-T6, a driving transistor Td, and a storage capacitor C. The storage capacitor C is connected between a first voltage supply terminal PVDD and a first node N1 and configured to maintain a potential of the first node N1. A first scan signal terminal S1 is configured to control the third switch transistor T3 and the fourth switch transistor T4. A second scan signal terminal S2 is configured to control the fifth switch transistor T5 and the sixth switch transistor T6. A light-emitting control signal terminal EMIT is configured to control the first switch transistor T1 and the second switch transistor T2. In a reset phase, a reference voltage terminal VREF resets the first node N and a second node N2 through the fifth switch transistor T5 and the sixth switch transistor T6. In a compensation phase, the third switch transistor T3 and the fourth switch transistor T4 are switched on while the other switch transistors are switched off, and a data signal terminal VDATA charges the first node N1 through the third switch transistor T3, the driving transistor Td and the fourth switch transistor T4, so that the potential of the first node N1 is charged to reach Vdata+Vth. Vdata is a data voltage of the data signal terminal VDATA, and Vth is a threshold voltage of the driving transistor Td. In a light-emitting phase, the first switch transistor T1 and the second switch transistor T2 are switched on while the other switch transistors are switched off, the driving transistor Td and a light-emitting element E are connected in series between the first voltage supply terminal PVDD and a second voltage supply terminal PVEE, the driving transistor Td generates a driving current under control of a voltage at the first node N1 to control the light-emitting element E to emit light. In the light-emitting phase, a current value of the driving current is independent of Vth, thereby avoiding adverse effects of threshold drift on displaying. However, in order achieve the light-emitting uniformity, the driving transistor Td usually has a large channel length. As a result, the charging current is small during the compensation phase, and in order stabilize the voltage at the first node N1, the storage capacitor C generally has a large capacitance value. Under a requirement for high resolution, the compensation phase for each pixel has a shorter duration, leading to a problem of insufficient charging. If compensation is made by adjusting the data voltage Vdata, power consumption would be increased. FIG. 2 is an equivalent circuit diagram of a part of the pixel driving circuit of FIG. 1 in a compensation phase, and FIG. 3 is an equivalent circuit diagram of a part of the pixel driving circuit of FIG. 1 in a light-emitting phase. As shown in FIG. 1 and FIG. 2, in the compensation phase, the voltage at the first node N1 is $V_t$, and a voltage at the first terminal of the driving transistor Td is $V_s$. Here, $V_s$ is a data voltage provided by the data signal terminal VDATA, and t is the charging time, i.e., a duration of the compensation phase. When t approaches 0, $V_t$ approaches ref. Here, ref is a reference voltage provided by the reference voltage terminal VREF, c is the capacitance value of the storage capacitor C, and $V_{th}$ is the threshold voltage of the driving transistor Td. In this case, an equation set I as follows is formed in the compensation phase:

$$\begin{cases} c\dfrac{dV_t}{dt} = k(V_t - V_s - V_{th})^2 \\ V_t \mid_{t=0} = ref \end{cases}.$$

Based on the above equation set, the following equation can be obtained:

$$-\frac{1}{V_t - V_s - V_{th}} = \frac{k}{c}t + \frac{1}{V_s + V_{th} - ref}.$$

Here, k is a constant number associated with a width-to-length ratio of the driving transistor Td.

As shown in FIG. 1 and FIG. 3, in the light-emitting phase, the driving transistor Td generates a driving current I under control of the voltage $V_t$ of the first node N1, and the driving current I satisfies the following formula.

$$I = k(V_t - VDD - V_{th})^2$$

-continued $$= k\left(\frac{-1}{\dfrac{k}{c}t + \dfrac{1}{V_s + V_{th} - ref}} + V_s - VDD\right)^2.$$

Due to the increased resolution and thus the insufficient compensation time, the effect of threshold voltage drift cannot be ignored.

Figure 4:
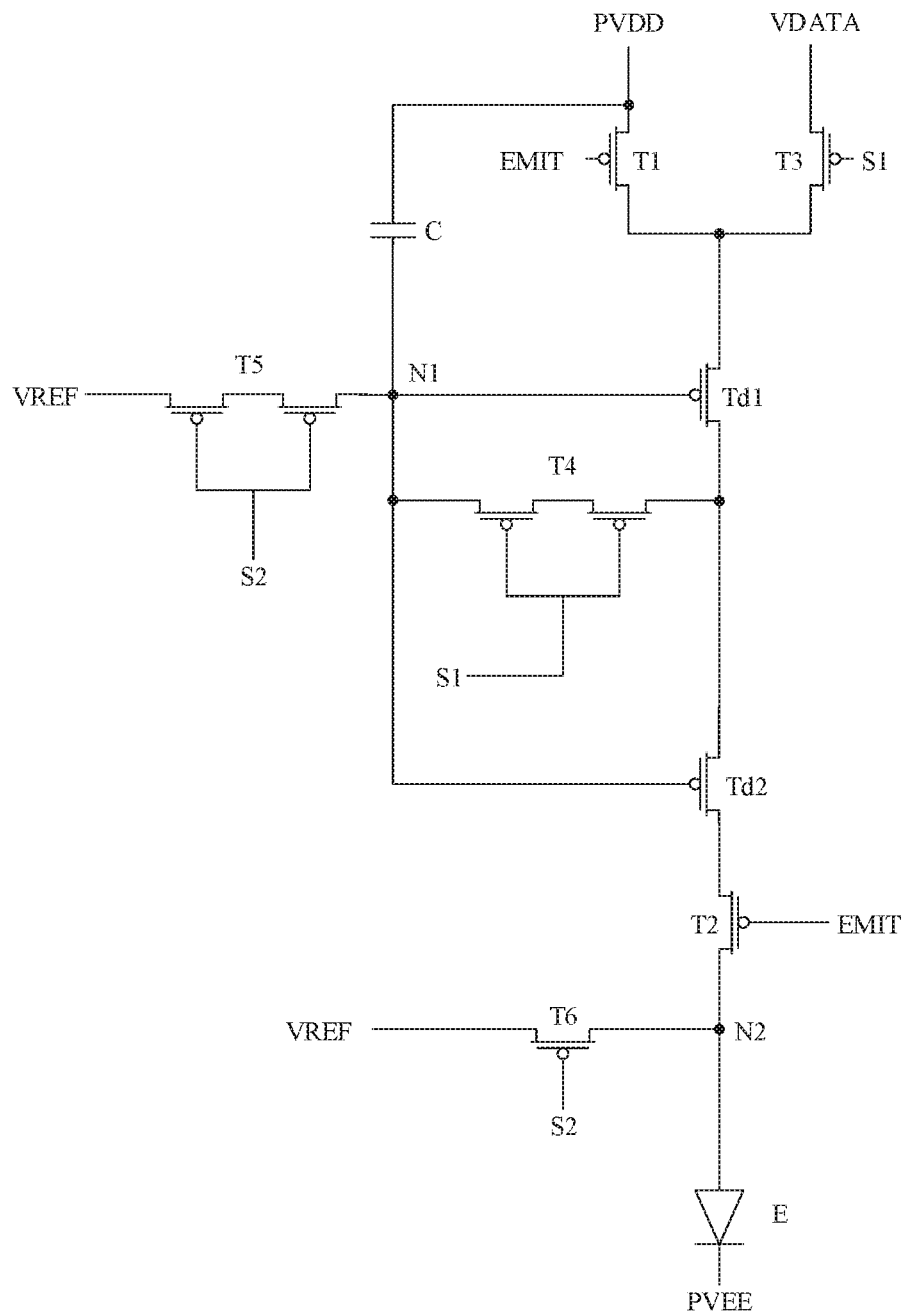
FIG. 4 is a schematic structural diagram of another organic light-emitting pixel driving circuit in the related art.

In order to solve the above problem, a solution of providing two driving transistors has appeared. FIG. 4 is a schematic structural diagram of another organic light-emitting pixel driving circuit in the related art. As shown in FIG. 4, a pixel driving circuit shown in FIG. 4 differs from the pixel driving circuit shown in FIG. 1 only in providing two driving transistors instead of one driving transistor. Herein, a first driving transistor Td1 is arranged in the same manner as the driving transistor Td shown in FIG. 1, and a second driving transistor Td2 is further provided. In this way, the first driving transistor Td1 does not need to have a large channel length, and thus the charging current during the compensation phase can be increased. Therefore, the first node N1 can be charged to reach a required potential in a shorter time, thereby reducing an undercharge probability. However, for the structure shown in FIG. 4, during the actual test process, it has been found that the threshold drift of the second driving transistor Td2 is approximately twice the threshold drift of the first driving transistor Td1, and therefore, a display afterimage may occur due to insufficient compensation for the threshold drift. The embodiments of the present disclosure propose solutions against the display afterimage problem caused by insufficient compensation for the threshold drift of the two driving transistors.

Figure 5:
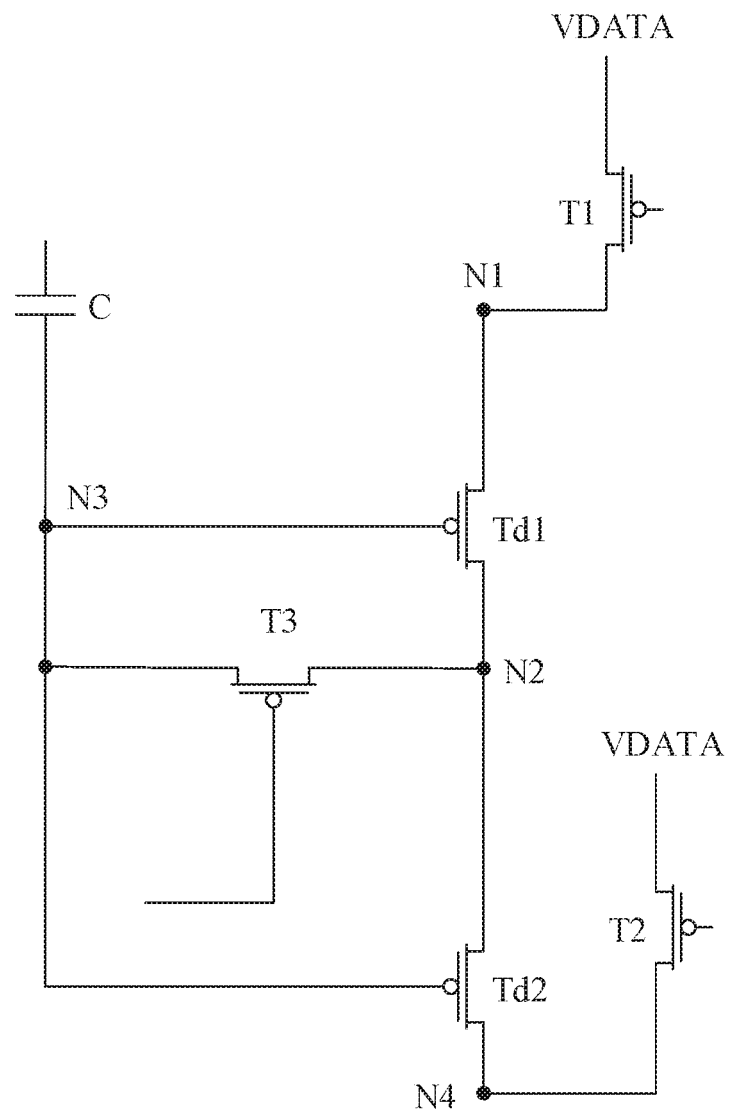
FIG. 5 is a structural diagram of a part of an organic light-emitting pixel driving circuit according to an embodiment of the present disclosure.

FIG. 5 is a structural diagram of a part of an organic light-emitting pixel driving circuit according to an embodiment of the present disclosure. As shown in FIG. 5, an embodiment of the present disclosure provides an organic light-emitting pixel driving circuit, including: a first driving transistor Td1 having a first terminal electrically connected to a first node N1, a second terminal electrically connected to a second node N2, and a control terminal electrically connected to a third node N3; a second driving transistor Td2 having a first terminal electrically connected to the second node N2, a second terminal electrically connected to a fourth node N4, and a control terminal electrically connected to the third node N3; a first switch transistor T1 having a first terminal electrically connected to a data signal terminal VDATA, and a second terminal electrically connected to the first node N1; a second switch transistor T2 having a first terminal electrically connected to the data signal terminal VDATA, and a second terminal electrically connected to the fourth node N4; a third switch transistor T3 having a first terminal electrically connected to the third node N3, and a second terminal electrically connected to the second node N2; and a storage device C electrically connected to the third node N3.

Figure 6:
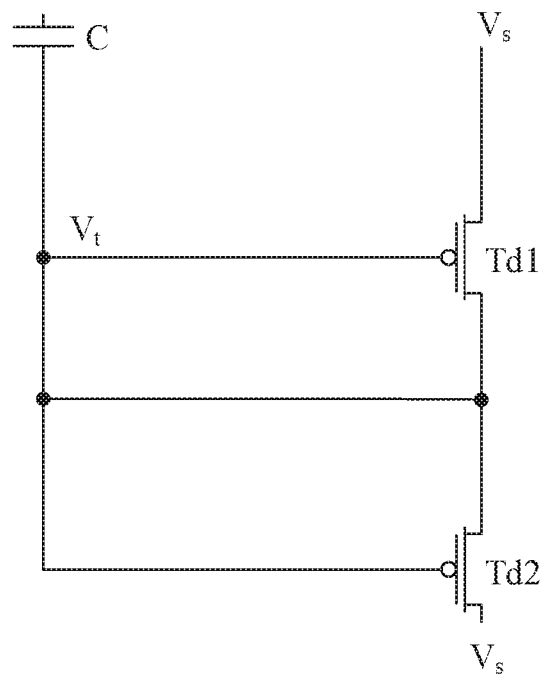
FIG. 6 is an equivalent circuit diagram of the part of the pixel driving circuit of FIG. 5 in a compensation phase.
Figure 7:
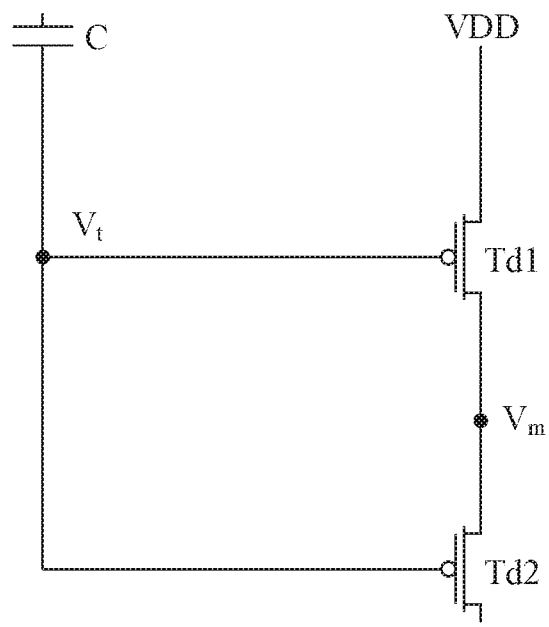
FIG. 7 is an equivalent circuit diagram of the part of the pixel driving circuit of FIG. 5 in a light-emitting phase.

FIG. 6 is an equivalent circuit diagram of the part of the pixel driving circuit of FIG. 5 in a compensation phase, and FIG. 7 is an equivalent circuit diagram of the part of the pixel driving circuit of FIG. 5 in a light-emitting phase. As shown in FIGS. 5 to 7, an embodiment of the present disclosure further provides a driving method for the organic light-emitting pixel driving circuit described above. The method includes following steps.

In a compensation phase, the first switch transistor T1, the second switch transistor T2, and the third switch transistor T3 are controlled to be switched on, so that the first driving transistor Td1 and the second driving transistor Td2 are connected in parallel and a data signal of the data signal terminal VDATA charges the third node N3 through the first driving transistor Td1 and the second driving transistor Td2, respectively.

In a light-emitting phase, the first switch transistor T1, the second switch transistor T2, and the third switch transistor T3 are controlled to be switched off, so that the first driving transistor Td1 and the second driving transistor Td2 are connected in series to generate a driving current for light-emitting under control at a voltage at the third node N3.

In the compensation phase, a voltage at the first node N1 and a voltage at the fourth node N4 each are $V_s$, which is a data voltage provided by the data signal terminal VDATA. A voltage at the third node N3 is $V_t$, and t is charging time, i.e., a duration of the compensation phase. Here, c is a capacitance value of the storage capacitor C, and $V_{th}$ is a threshold voltage of the driving transistor Td1 or a threshold voltage of the second driving transistor Td2. It should be noted that in the actual circuit, the first driving transistor Td1 and the second driving transistor Td2 may have different threshold voltages, and for convenience of explanation, both the first driving transistor Td1 and the second driving transistor Td2 are set herein to have a threshold voltage of $V_{th}$. $V_m$ is a voltage at the second node N2. In this case, an equation set II as follows is applied in the compensation phase:

$$\begin{cases} c\dfrac{dV_t}{dt} = 4k(V_t - V_s - V_{th})^2 \\ V_t \mid_{t=0} = ref \end{cases}.$$

Compared with the equation set I, the compensation process is changed in such a manner that two driving transistors are connected in parallel to perform charging, so that a coefficient k thereof becomes 4k. Here, k is a constant number. Based on the equation set II, the following equation can be obtained:

$$-\frac{1}{V_t - V_s - V_{th}} = \frac{4k}{c}t + \frac{1}{V_s + V_{th} - ref}.$$

In the light-emitting phase, the first driving transistor Td1 generates a first driving current I1, and the first driving current I1 satisfies the following equation:

$$I1 = 4k\left[(V_t - V_s - V_{th})(V_m - V_s) - \frac{(V_m - V_s)^2}{2}\right].$$

The second driving transistor Td2 generates a first driving current I2, and the first driving current I2 satisfies the following equation:

$$I2 = 2k(V_t - V_s - V_{th})^2.$$

Based on that I1=I2, the following equation can be obtained:

$$V_t - V_m - V_{th} = \frac{1}{\sqrt{2}}(V_t - V_s - V_{th}).$$

Then, $V_m$ can be obtained, and the following equation can be obtained by substituting $V_m$ into I1 or I2:

$$I1 = k(V_t - VDD - V_{th})^2$$

$$= k\left(\frac{-1}{\frac{4k}{c}t + \frac{1}{V_s + V_{th} - ref}} + V_s - VDD\right)^2.$$

Compared with the formula corresponding to the driving current I of FIG. 1, the charging speed is four times the original charging time, and at the same time, k in the denominator of $V_t$ becomes 4k, that is, $V_{th}$ has less influence on the driving current.

In addition, compared with the pixel driving circuit shown in FIG. 4, the pixel driving circuit in this embodiment of the present disclosure changes the charging mode in the compensation phase, in which two driving transistors simultaneously perform charging. In this way, the charging speed is higher, and the threshold drift can be better eliminated. For details, please refer to results of simulations as follows.

TABLE 1

| Structure of pixel driving circuit | Width-to-length ratio of the driving transistor | Storage Capacitance value (pF) | Relative current change |
|---|---|---|---|
| A1 | 3/17 | 0.108 | 0.3% |
| A2 | 3/17 | 0.108 | 10% |
| A3 | 3/17 | 0.108 | 1.4% |

Table 1 shows the simulation results of relative current changes corresponding to different structures of the pixel driving circuit when an amount of the threshold drift is 0.1V. As shown in Table 1, when a structure of the pixel driving circuit includes two driving transistors, width-to-length ratios of the two driving transistors are both 3/17. The storage capacitance value is the capacitance value of the storage device or the storage capacitor. A1 represents a structure of the pixel driving circuit shown in FIG. 1, that is, the pixel driving circuit includes only one driving transistor. A2 represents a structure of the pixel driving circuit shown in FIG. 4, that is, the pixel driving circuit includes two driving transistors, and only one of the two driving transistors performs charging in the compensation phase. A3 represents a structure of the pixel driving circuit shown in FIG. 5, that is, the pixel driving circuit includes two transistors, and the two driving transistors are connected in parallel to perform charging in the compensation phase. It can be seen from Table 1 that with a same among of the threshold voltage drift, A3 has a smaller current change compared with A2, that is, A3 can more effectively compensate for the threshold voltage drift.

Figure 8:
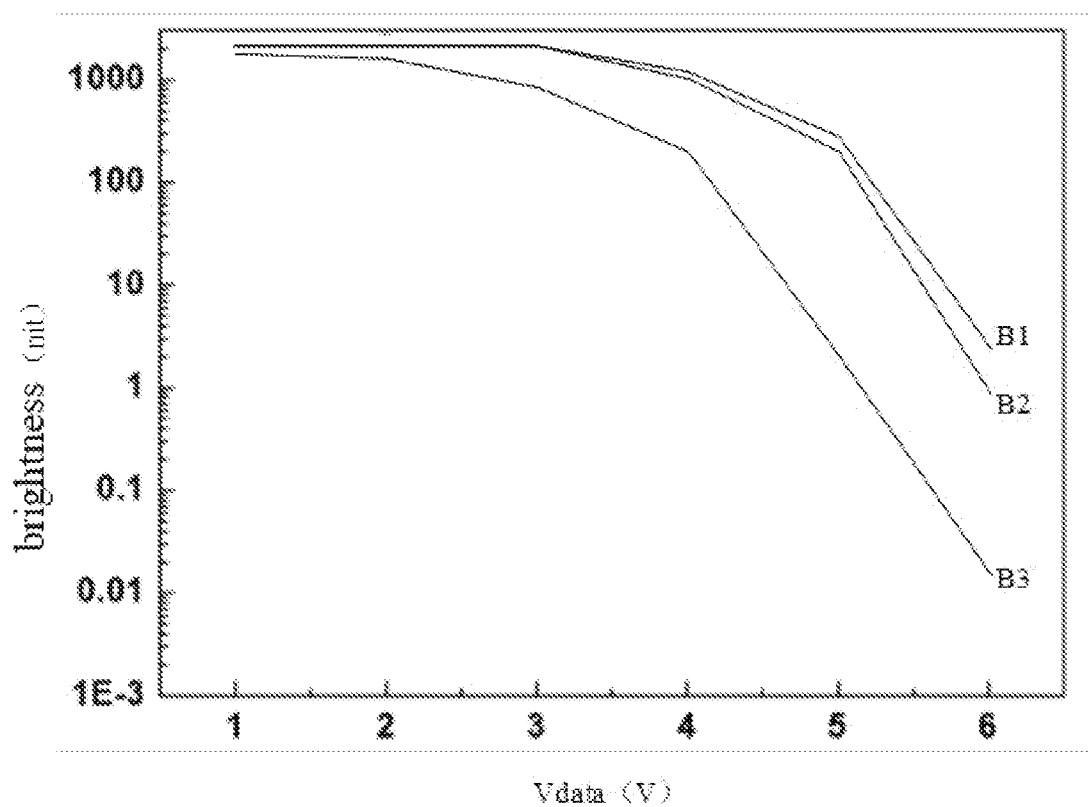
FIG. 8 is a curve diagram illustrating test curves of pixels of three different pixel driving circuits.

FIG. 8 is a curve diagram illustrating test curves of pixels of three different pixel driving circuits. As shown in FIG. 8, B1 represents a test curve corresponding to the structure of the pixel driving circuit shown in FIG. 1, B2 represents a test curve corresponding to the structure of the pixel driving circuit shown in FIG. 4, and B3 presents a test curve corresponding to the structure of the pixel driving circuit shown in FIG. 5. Brightness values of different gray scale test display panels are stimulated under different data voltages Vdata. Here, the driving current for each light-emitting element is controlled to be consistent, and the compensation phase has a duration of 1.25 μs. It can be seen that in a shorter compensation time, Vdata is 6V, indicating a black state of grayscale. The brightness of the display panel in the black state of grayscale can still reach 0.01 nit in the curve of B3, indicating that in the three structures, the pixel driving circuit in this embodiment of the present disclosure has the highest charging speed in the compensation phase.

For the organic light-emitting pixel driving circuit and the driving method in this embodiment of the present disclosure, the two driving transistors are connected in parallel to perform charging in the compensation phase, and the two driving transistors are connected in series to drive light-emitting in the light-emitting phase. In this way, the charging speed in the compensation phase is improved, thereby improving the poor display caused by insufficient charging time. Moreover, the threshold voltage drift can be more effectively compensated, thereby improving the poor display caused by the threshold drift.

Figure 9:
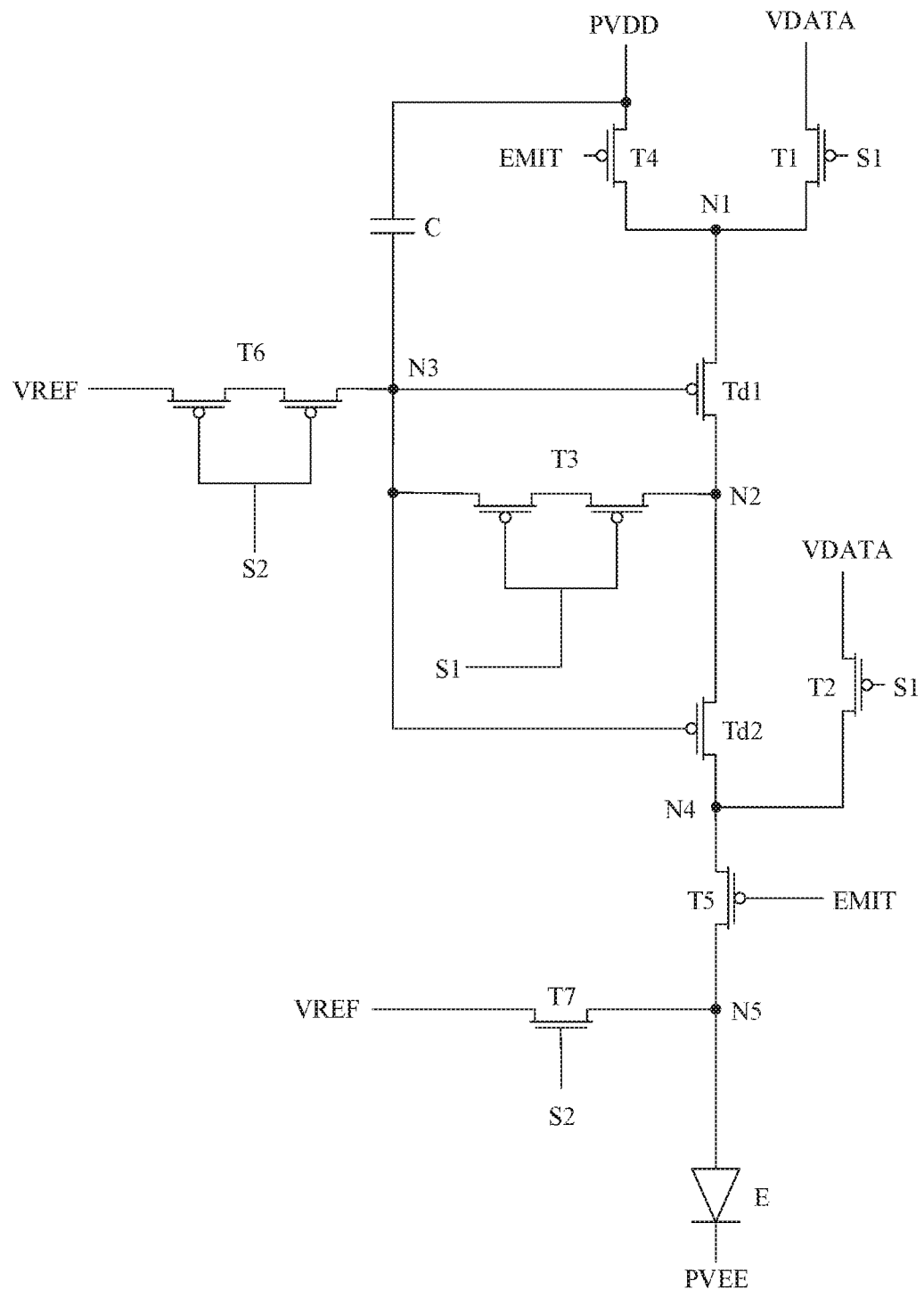
FIG. 9 is a schematic structural diagram of an organic light-emitting pixel driving circuit according to an embodiment of the present disclosure.

FIG. 9 is a schematic structural diagram of an organic light-emitting pixel driving circuit according to an embodiment of the present disclosure. In an embodiment, as shown in FIG. 9, the first switch transistor T1, the second switch transistor T2, and the third switch transistor T3 each have a control terminal electrically connected to the first scan signal terminal S1. In other words, these three switch transistors are controlled in the simplest manner.

Figure 10:
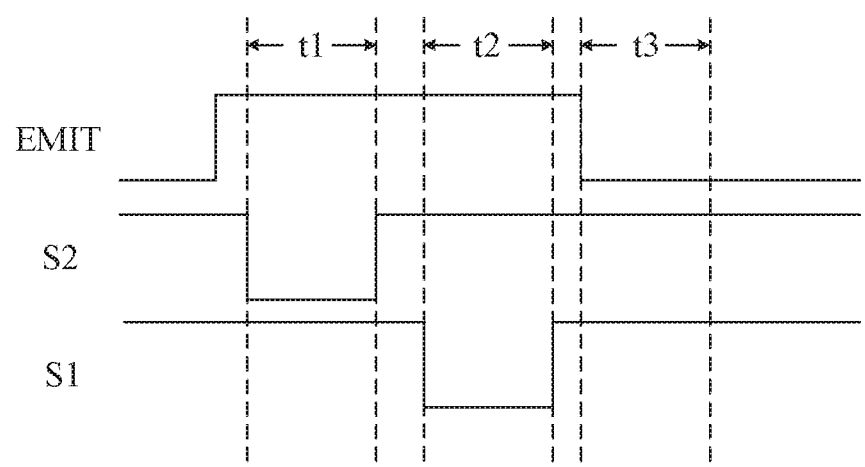
FIG. 10 is a timing signal diagram corresponding to the organic light-emitting pixel driving circuit of FIG. 9.

FIG. 10 is a timing signal diagram corresponding to the organic light-emitting pixel driving circuit of FIG. 9. In an embodiment, as shown in FIG. 9 and FIG. 10, on the basis of the abovementioned driving method, in the compensation phase t2, the first switch transistor T1, the second switch transistor T2 and the third switch transistor T3 are switched on in response to the switch-on level of the first scan signal terminal S1, so that the first driving transistor Td1 and the second driving transistor Td2 are connected in parallel and the data signal of the data signal terminal VDATA charges the third node N3 through the first driving transistor Td1 and the second driving transistor Td2. In the light-emitting phase t3, the first switch transistor T1, the second switch transistor T2 and the third switch transistor T3 are switched off in response to the switch-off level of the first scan signal terminal S1, so that the first driving transistor Td1 and the second driving transistor Td2 are connected in series to generate a driving current for light-emitting under control of a voltage at the third node N3.

In an embodiment, the organic light-emitting pixel driving circuit further includes: a fourth switch transistor T4 having a first terminal electrically connected to the first voltage supply terminal PVDD, a second terminal electrically connected to the first node N1, and a control terminal electrically connected to the light-emitting control signal terminal EMIT; a fifth switch transistor T5 having a first terminal electrically connected to the fourth node N4, a second terminal electrically connected to the fifth node N5, and a control terminal electrically connected to the light-emitting control signal terminal EMIT; and an organic light-emitting element E having an anode electrically connected to the fifth node N5, and a cathode electrically connected to the second voltage supply terminal PVEE.

In an embodiment, on the basis of the abovementioned driving method, in the compensation phase t2, the fourth switch transistor T4 and the fifth switch transistor T5 are switched off in response to the switch-off level of the light-emitting control signal terminal EMIT, thereby preventing adverse effects on the light-emitting brightness of the organic light-emitting element E in the compensation phase while preventing adverse effects of other potentials on the charging process of the two driving transistors connected in parallel in the compensation phase. In the light-emitting phase t3, the fourth switch transistor T4 and the fifth switch transistor T5 are switched on in response to the switch-on level of the light-emitting control signal terminal EMIT, and the organic light-emitting element E emits light under control of the driving current.

In an embodiment, the storage device C includes a storage capacitor. The storage capacitor has a first terminal electrically connected to the first voltage supply terminal PVDD, and a second terminal electrically connected to the third node N3. The storage capacitor is configured to maintain a potential at the third node N3, and can be connected between the first voltage supply terminal PVDD and the third node N3. Since the potential at the first voltage supply terminal PVDD maintains unchanged, a potential at the third node N3 maintains unchanged in the light-emitting phase. However, in other embodiments, the storage capacitor may also be connected between the third node N3 and another fixed potential, as long as the potential at the third node N3 maintains unchanged in the light-emitting phase.

In an embodiment, the abovementioned organic light-emitting pixel driving circuit further includes: a sixth switch transistor T6 having a first terminal electrically connected to the reference voltage terminal VREF, a second terminal electrically connected to the third node N3, and a control terminal electrically connected to the second scan signal terminal S2.

In an embodiment, on the basis of the abovementioned driving method, the driving method further includes the following steps. In the reset phase t1, the sixth switch transistor T6 is switched on in response to the switch-on level of the second scan signal terminal S2, and the reference voltage of the reference voltage terminal VREF is transmitted to the third node N3 to reset the third node N3; the first switch transistor T1, the second switch transistor T2, and the third switch transistor T3 are switched off in response to the switch-off level of the first scan signal terminal S1 and the fourth switch transistor T4 and the fifth switch transistor T5 are switched off in response to switch-off level of the light-emitting control signal terminal EMIT. In the compensation phase t2, the sixth switch transistor T6 is switched off in response to the switch-off level of the second scan signal terminal S2. In the light-emitting phase t3, the sixth switch transistor T6 is switched off in response to the switch-off level of the second scan signal terminal S2.

The third node N3 can be reset through the sixth switch transistor T6, thereby achieving stability in the compensation phase.

In an embodiment, the organic light-emitting pixel driving circuit further includes: a seventh switch transistor T7 having a first terminal electrically connected to the reference voltage terminal VREF, a second terminal electrically connected to the fifth node N5, and a control terminal electrically connected to the second scan signal terminal S2. It can be understood that in other embodiments, the control terminal of the seventh switch transistor T7 can also be electrically connected to another control signal terminal such as the first scan signal terminal, as long as the anode of the organic light-emitting element E can be reset before the light-emitting phase t3.

In an embodiment, on the basis of the abovementioned driving method, in the reset phase t1, the seventh switch transistor T7 is switched on in response to the switch-on level of the second scan signal terminal S2, and the reference voltage of the reference voltage terminal VREF is transmitted to the fifth node N5 to reset the anode of the organic light-emitting element E. In the compensation phase t2, the seventh switch transistor T7 is switched off in response to the switch-off level of the second scan signal terminal S2. In the light-emitting phase t3, the seventh switch transistor T7 is switched off in response to the switch-off level of the second scan signal terminal S2.

The organic light-emitting pixel driving circuit in this embodiment of the present disclosure will be described in the following with reference to FIG. 9 and FIG. 10 through a driving method.

In the reset phase t1, a high level is provided at the light-emitting control signal terminal EMIT to control the fourth switch transistor T4 and the fifth switch transistor T5 to be switched off, and the organic light-emitting element E does not emit light; a low level is provided at the second scan signal terminal S2 to control the sixth switch transistor T6 to be switched on, and the reference voltage of the reference voltage terminal VREF is transmitted to the third node N3 to reset the third node N3, herein, the reference voltage is at low level; a high level is provided at the first scan signal terminal S1 to control the first switch transistor T1, the third switch transistor T3 and the fifth switch transistor T5 to be switched off; a low level is provided at the second scan signal terminal S2 to control the seventh switch transistor T7 to be switched on, and the reference voltage of the reference voltage terminal VREF is transmitted to the fifth node N5 to reset the anode of the organic light-emitting element E.

In the compensation phase t2, a high level is provided at the light-emitting control signal terminal EMIT to control the fourth switch transistor T4 and the fifth switch transistor T5 to be switched off, and the organic light-emitting element E does not emit light; a high level is provided at the second scan signal terminal S2 to control the sixth switch transistor T6 to be switched off; a low level is provided at the first scan signal terminal S to control the first switch transistor T1, the third switch transistor T3 and the fifth switch transistor T5 to be switched on, so that the first driving transistor Td1 and the second driving transistor Td2 are connected in parallel and the data signal of the data signal terminal VDATA charges the third node N3 through the first driving transistor Td1 and the second driving transistor Td2, with reference to FIG. 6 and the above description with respect to FIG. 6, the potential $V_t$ of the third node N3 satisfies the equation $$-\frac{1}{V_t - V_s - V_{th}} = \frac{4k}{c}t + \frac{1}{V_s + V_{th} - ref};$$

and a high level is provided at the second scan signal terminal S2 to control the seventh switch transistor T7 to be switched off.

In the light-emitting phase t3, a low level is provided at the light-emitting control signal terminal EMIT to control the fourth switch transistor T4 and the fifth switch transistor T5 to be switched on; a high level is provided at the second scan signal terminal S2 to control the sixth switch transistor T6 to be switched off; a high level is provided at the first scan signal terminal S1 to control the first switch transistor T1, the third switch transistor T3, and the fifth switch transistor T5 to be switched off; a high level is provided at the second scan signal terminal S2 to control the seventh switch transistor T7 to be switched off; the potential at the third node N3 is maintained at $V_t$ under control of the storage capacitor C; the driving current I is generated by the first driving transistor Td1 and the second driving transistor Td2 under control of the potential at the third node N3. With reference to FIG. 7 and the abovementioned description with respect to FIG. 7, the driving current I satisfies the following equation"

$$I = k(V_t - VDD - V_{th})^2$$

$$= k\left(\frac{-1}{\frac{k}{c}t + \frac{1}{V_s + V_{th} - ref}} + V_s - VDD\right)^2.$$

It should be noted that FIG. 9 is merely a schematic structural diagram of an exemplary organic light-emitting pixel driving circuit in the embodiments of the present disclosure. The structure of the organic light-emitting pixel driving circuit is not limited herein by the present disclosure, as long as the two driving transistors are connected in parallel to perform charging in the compensation phase, and the two driving transistors are connected in series to generate a driving current in the light-emitting phase.

Figure 11:
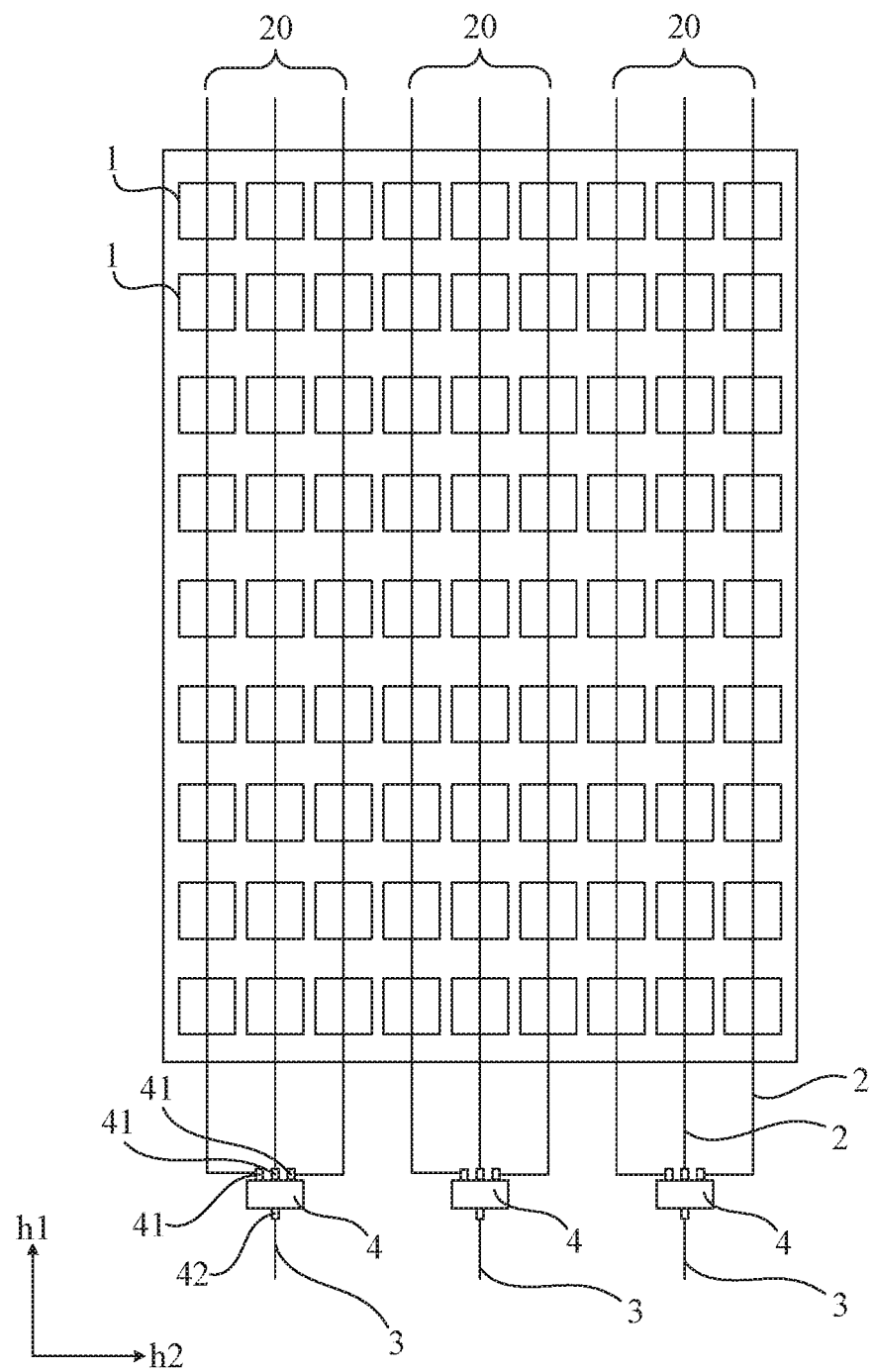
FIG. 11 is a schematic structural diagram of a display panel according to an embodiment of the present disclosure.

FIG. 11 is a schematic structural diagram of a display panel according to an embodiment of the present disclosure. As shown in FIG. 11, an embodiment of the present disclosure provides a display panel including the organic light-emitting pixel driving circuit 1 described above.

The structure, principle, and driving method of the organic light-emitting pixel driving circuit are the same as those in the above embodiments, and will not be further described herein.

For the display panel provided by the embodiments of the present disclosure, the two driving transistors are connected in parallel to perform charging in the compensation phase, and the two driving transistors are connected in series to generate a driving current in the light-emitting phase. In this way, the charging speed in the compensation phase is increased, thereby improving the poor display caused by insufficient charging time. Moreover, the threshold voltage drift can be more effectively compensated, thereby improving the poor display caused by the threshold drift.

In an embodiment, the display panel includes: a plurality of sub-pixels arranged in an array, each of which includes an organic light-emitting pixel driving circuit 1; a plurality of data lines 2 extending along a first direction h and arranged along a second direction h2, every n data lines 2 of which form a set of data lines 20; a source signal line 3 corresponding to each set of data lines 20; and a multiplexer 4 corresponding to each set of data lines 20. The multiplexer 4 includes: strobe terminals 41 electrically connected to the data lines 2 of the respective set 20 of data lines; and a communication terminal 42 electrically connected to the source signal line 3. The multiplexer 4 is configured to make the communication terminal 42 time-divisionally communicate with each of the strobe terminals 41.

With the multiplexers 4, space occupied by the data lines 2 in the non-display area can be reduced, and pins of the driving chip can be reduced, so that the data lines 2 of each set 20 of data lines can be electrically connected to a same source signal line 3 through the respective multiplexer 4. Then, the source signal line 3 is connected to the driving chip. The data line 2 is electrically connected to the data signal terminal VDATA in each column of the organic light-emitting pixel driving circuit in the display area. The driving chip time-divisionally provides a data voltage to the data lines 2 of each set 20 of data lines through the respective source signal line 3. However, this reduces the time for the driving chip to provide the data voltage to each data line 2, thereby reducing the duration of the compensation phase. Therefore, the display panel provided with the multiplexer 4 is more applicable for the organic light-emitting pixel driving circuit in the embodiments of the present disclosure.

Figure 12:
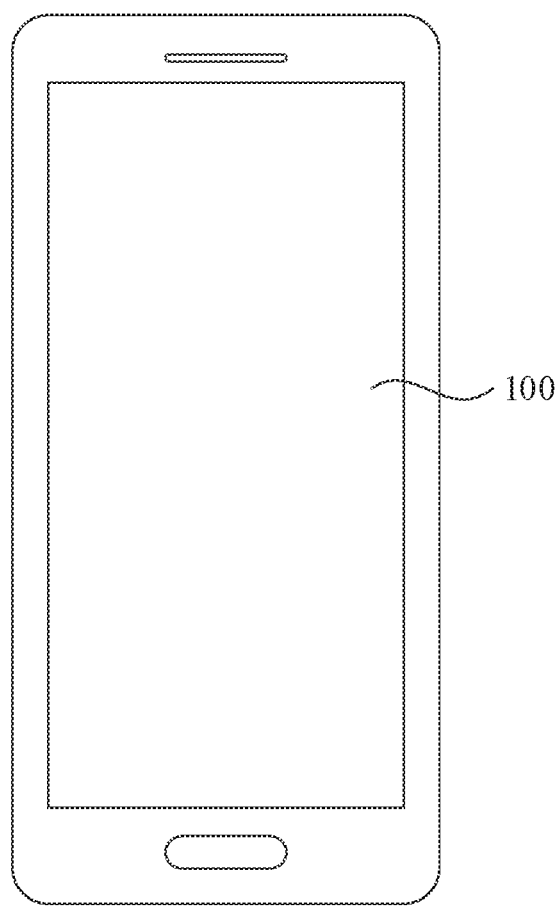
FIG. 12 is a schematic structural diagram of a display device according to an embodiment of the present disclosure.

FIG. 12 is a schematic structural diagram of a display device according to an embodiment of the present disclosure. As shown in FIG. 12, an embodiment of the present disclosure provides a display device, including the display panel described above.

The structure and principle of the display panel 100 are the same as those in the above embodiments, and details are not further described herein. The display device may be any electronic device having a display function, such as a touch display screen, a cellphone, a tablet computer, a notebook computer, an electronic paper book, or a television.

For the display device provided by the embodiments of the present disclosure, the two driving transistors are connected in parallel to perform charging in the compensation phase, and the two driving transistors are connected in series to generate a driving current in the light-emitting phase. In this way, the charging speed in the compensation phase is increased, thereby improving the poor display caused by insufficient charging time. Moreover, the threshold voltage drift can be more effectively compensated, thereby improving the poor display caused by the threshold drift.

What is claimed is:

1. An organic light-emitting pixel driving circuit, comprising:
   a first driving transistor having a first terminal electrically connected to a first node, a second terminal electrically connected to a second node, and a control terminal electrically connected to a third node;
   a second driving transistor having a first terminal electrically connected to the second node, a second terminal electrically connected to a fourth node, and a control terminal electrically connected to the third node;
   a first switch transistor having a first terminal electrically connected to a data signal terminal, and a second terminal electrically connected to the first node;
   a second switch transistor having a first terminal electrically connected to the data signal terminal, and a second terminal electrically connected to the fourth node;
   a third switch transistor having a first terminal electrically connected to the third node, and a second terminal electrically connected to the second node; and
   a storage device electrically connected to the third node.

2. The organic light-emitting pixel driving circuit according to claim 1, wherein the first switch transistor, the second switch transistor, and the third switch transistor each have a control terminal electrically connected to a first scan signal terminal.

3. The organic light-emitting pixel driving circuit according to claim 2, further comprising:
   a fourth switch transistor having a first terminal electrically connected to a first voltage supply terminal, a second terminal electrically connected to the first node, and a control terminal electrically connected to a light-emitting control signal terminal;
   a fifth switch transistor having a first terminal electrically connected to the fourth node, a second terminal electrically connected to a fifth node, and a control terminal electrically connected to the light-emitting control signal terminal; and
   an organic light-emitting element having an anode electrically connected to the fifth node, and a cathode electrically connected to a second voltage supply terminal.

4. The organic light-emitting pixel driving circuit according to claim 3, wherein the storage device comprises a storage capacitor, and the storage capacitor has a first terminal electrically connected to the first voltage supply terminal, and a second terminal electrically connected to the third node.

5. The organic light-emitting pixel driving circuit according to claim 3, further comprising:
   a sixth switch transistor having a first terminal electrically connected to a reference voltage terminal, a second terminal electrically connected to the third node, and a control terminal electrically connected to a second scan signal terminal.

6. The organic light-emitting pixel driving circuit according to claim 5, further comprising:
   a seventh switch transistor having a first terminal electrically connected to the reference voltage terminal, a second terminal electrically connected to the fifth node, and a control terminal electrically connected to the second scan signal terminal.

7. A driving method, applied in the organic light-emitting pixel driving circuit according to claim 1, comprising:
   in a compensation phase, controlling the first switch transistor, the second switch transistor, and the third switch transistor to be switched on, so that the first driving transistor and the second driving transistor are connected in parallel and a data signal of the data signal terminal charges the third node through the first driving transistor and the second driving transistor; and
   in a light-emitting phase, controlling the first switch transistor, the second switch transistor, and the third switch transistor to be switched off, so that the first driving transistor and the second driving transistor are connected in series to generate a driving current for light-emitting under control of a voltage at the third node.

8. The driving method according to claim 7, wherein the first switch transistor, the second switch transistor, and the third switch transistor each have a control terminal electrically connected to a first scan signal terminal,
   in the compensation phase, the first switch transistor, the second switch transistor, and the third switch transistor are switched on in response to a switch-on level of the first scan signal terminal, so that the first driving transistor and the second driving transistor are connected in parallel and the data signal of the data signal terminal charges the third node through the first driving transistor and the second driving transistor; and
   in the light-emitting phase, the first switch transistor, the second switch transistor, and the third switch transistor are switched off in response to a switch-off level of the first scan signal terminal, so that the first driving transistor and the second driving transistor are connected in series to generate the driving current for light-emitting under control of the voltage at the third node.

9. The driving method according to claim 8, wherein the organic light-emitting pixel driving circuit further comprises:
   a fourth switch transistor having a first terminal electrically connected to a first voltage supply terminal, a second terminal electrically connected to the first node, and a control terminal electrically connected to a light-emitting control signal terminal;

a fifth switch transistor having a first terminal electrically connected to the fourth node, a second terminal electrically connected to a fifth node, and a control terminal electrically connected to the light-emitting control signal terminal; and an organic light-emitting element having an anode electrically connected to the fifth node, and a cathode electrically connected to a second voltage supply terminal, wherein in the compensation phase, the fourth switch transistor and the fifth switch transistor are switched off in response to a switch-off level of the light-emitting control signal terminal; and in the light-emitting phase, the fourth switch transistor and the fifth switch transistor are switched on in response to a switch-on level of the light-emitting control signal terminal, and the organic light-emitting element emits light under control of the driving current.

10. The driving method according to claim 9, wherein the organic light-emitting pixel driving circuit further comprises:

a sixth switch transistor having a first terminal electrically connected to a reference voltage terminal, a second terminal electrically connected to the third node, and a control terminal electrically connected to a second scan signal terminal, wherein the driving method further comprises:

in a reset phase, switching on the sixth switch transistor in response to a switch-on level of the second scan signal terminal, and transmitting a reference voltage of the reference voltage terminal to the third node to reset the third node; switching off the first switch transistor, the second switch transistor and the third switch transistor in response to the switch-off level of the first scan signal terminal; and switching off the fourth switch transistor and the fifth switch transistor in response to the switch-off level of the light-emitting control signal terminal;

in the compensation phase, switching off the sixth switch transistor in response to a switch-off level of the second scan signal terminal; and in the light-emitting phase, switching off the sixth switch transistor in response to the switch-off level of the second scan signal terminal.

11. The driving method according to claim 10, wherein the organic light-emitting pixel driving circuit further comprises:

a seventh switch transistor having a first terminal electrically connected to the reference voltage terminal, a second terminal electrically connected to the fifth node, and a control terminal electrically connected to the second scan signal terminal, wherein the driving method further comprises:

in the reset phase, switching on the seventh switch transistor on in response to the switch-on level of the second scan signal terminal, and transmitting the reference voltage of the reference voltage terminal to the fifth node to reset the anode of the organic light-emitting element;

in the compensation phase, switching off the seventh switch transistor in response to the switch-off level of the second scan signal terminal; and in the light-emitting phase, switching off the seventh switch transistor in response to the switch-off level of the second scan signal terminal.

12. A display panel, comprising the organic light-emitting pixel driving circuit according to claim 1.

13. The display panel according to claim 12, comprising:

a plurality of sub-pixels arranged in an array, each of the plurality of sub-pixels comprising the organic light-emitting pixel driving circuit;

a plurality of data lines extending along a first direction and arranged along a second direction, wherein every n data lines of the plurality of data lines form a set of data lines;

a source signal line corresponding to each set of data lines;

a multiplexer corresponding to each set of data lines, wherein the multiplexer comprises: strobe terminals electrically connected to data lines of the set of data lines, and a communication terminal electrically connected to the source signal line, and the multiplexer is configured to make the communication terminal time-divisionally communicate with each of the strobe terminals.

* * * * *